United States Patent [19]

Thillays et al.

[11] Patent Number: 4,797,715
[45] Date of Patent: Jan. 10, 1989

[54] OPTOELECTRIC COMPONENT FOR SURFACE MOUNTING

[75] Inventors: Jacques C. Thillays; Jean-Claude A. Vallee, both of Herouville, France

[73] Assignee: U.S. Philips Corporation, New York, N.Y.

[21] Appl. No.: 924,550

[22] Filed: Oct. 29, 1986

[30] Foreign Application Priority Data

Nov. 5, 1985 [FR] France ............................ 8516374

[51] Int. Cl.$^4$ ...................... H01L 33/00; H01L 29/06; H01L 27/14; H01L 29/04
[52] U.S. Cl. ......................................... 357/17; 357/20; 357/30; 357/55; 357/56; 357/60
[58] Field of Search ................... 357/60, 55, 56, 30 R, 357/30 D, 30 G, 30 H, 30 P, 30 Q, 17, 20

[56] References Cited

U.S. PATENT DOCUMENTS

| | | | |
|---|---|---|---|
| 4,040,078 | 8/1977 | Eckton, Jr. et al. | 357/30 D |
| 4,104,674 | 8/1978 | Lorenze, Jr. et al | 357/30 D |
| 4,206,005 | 6/1980 | Yeh et al. | 357/55 |
| 4,441,791 | 4/1984 | Hornbeck | 357/30 L |

Primary Examiner—J. Carroll
Assistant Examiner—Ngan Van Ngo
Attorney, Agent, or Firm—Steven R. Biren

[57] ABSTRACT

The invention relates to an optoelectronic component for surface mounting of the type having an opto-electronic element arranged on the bottom of a cavity provided in a support and to the method of manufacturing same. The component includes a cavity coated with a metallization coating. The optoelectronic element is soldered on the bottom of the cavity. The support is a substrate of Si strongly doped with the first conductivity type, whose surfaces are orientated according to the plane (100), while the metallized surfaces of the cavity are formed by the preferential attack according to the planes (111). Regions of the second conductivity type are diffused into the cavity and into a cavity merging into the latter from the lower surface of the substrate. The element is soldered with suitable polarity, and insulation is provided by a diode connected with reverse polarity in parallel with its terminals. The contact points at the lower surface of the substrate permit surface mounting. The components are obtained by cutting the substrate in two directions.

8 Claims, 2 Drawing Sheets

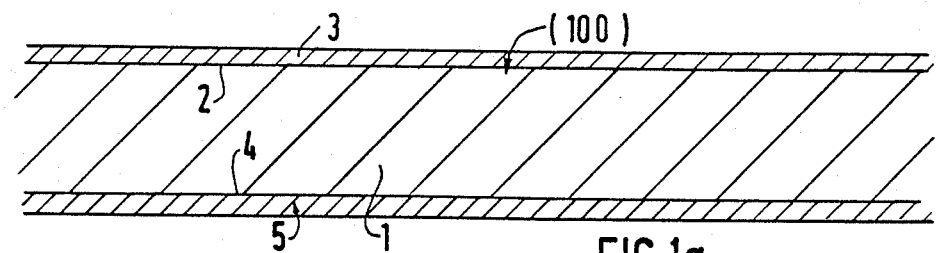
FIG.1a
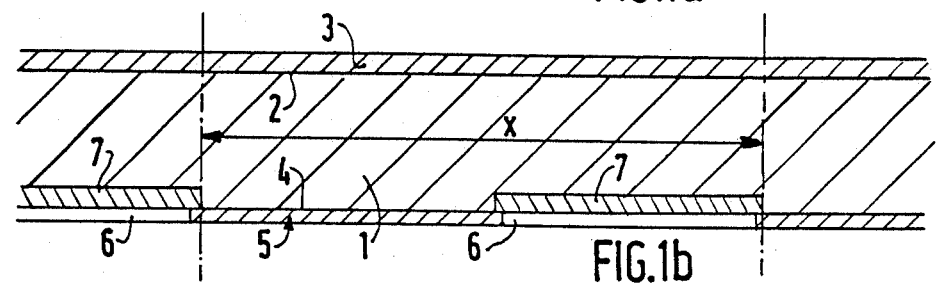
FIG.1b
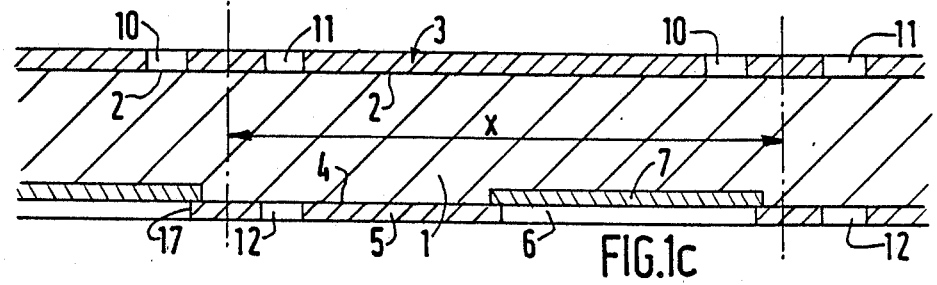
FIG.1c
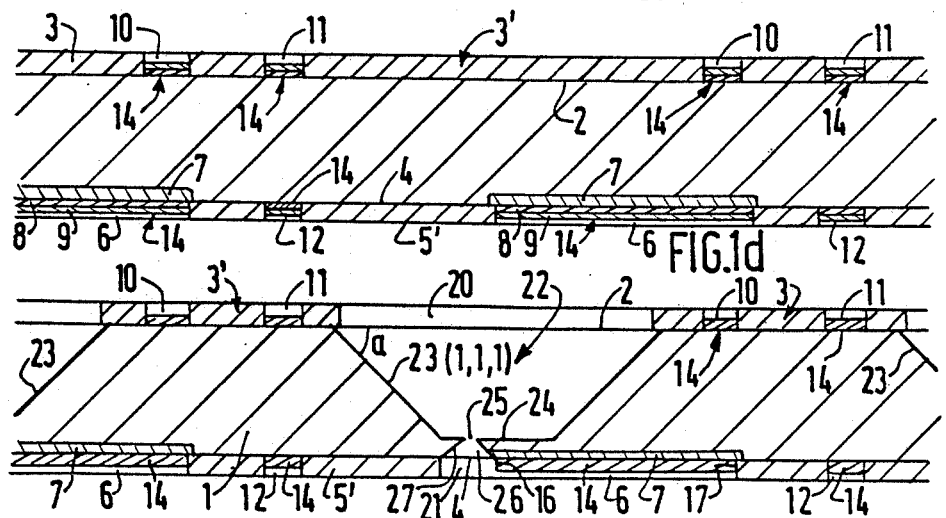
FIG.1d
FIG.1e

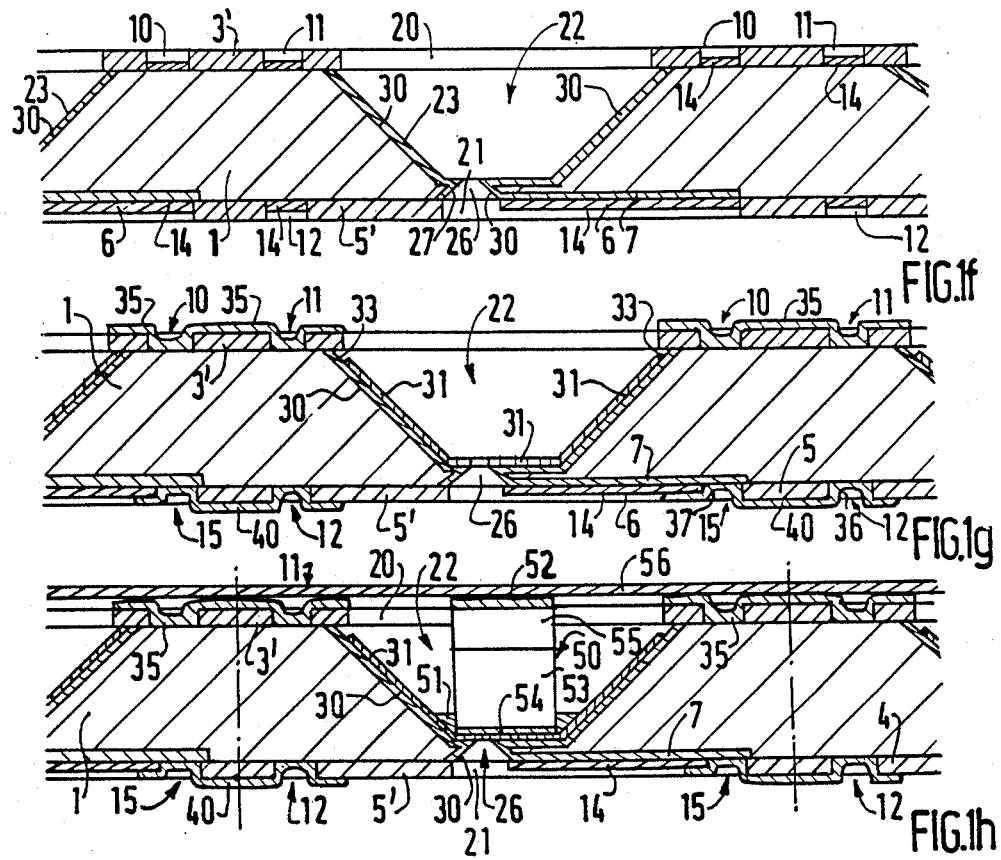
FIG.1f
FIG.1g
FIG.1h
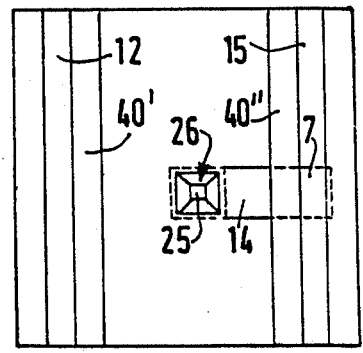
FIG.2a
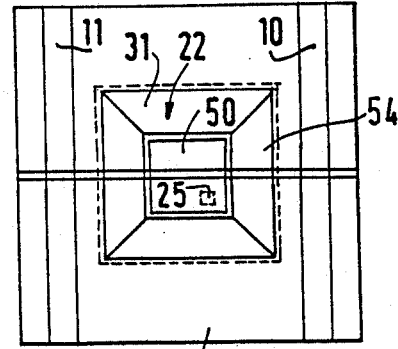
FIG.2b
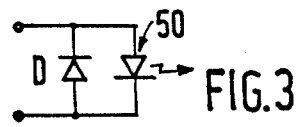
FIG.3

OPTOELECTRIC COMPONENT FOR SURFACE MOUNTING

BACKGROUND OF THE INVENTION

The invention relates to an optoelectronic component including an optoelectronic element disposed on the bottom of a first cavity provided in a highly doped silicon substrate of a first conductivity type and having upper and lower surfaces orientated along the plane (100), the surface of the first cavity being coated with a metallic layer in such a manner that it becomes reflective and this cavity having four faces disposed along (111) planes inclined with respect to the upper surface, and a flat bottom also coated with the metallic layer, the optoelectronic elements having a first electrode of a zone of the first conductivity type soldered at said flat bottom on the metallic layer and a second electrode of a zone of the second conductivity type connected electrically to the upper surface of the substrate.

Such a component is known from Japanese patent application JP-A No. 54-18692 published on Feb. 10 1979.

The problem to which the present invention is directed is how to manufacture at low cost, an optoelectronic component for surface mounting provided with a reflective cavity for improving the optical efficiency, which implies that the basic material is readily available and comparatively inexpensive and that the components are manufactured collectively. The optoelectronic component according to JP-A No. 54-18692 is not suitable for surface mounting.

An optoelectronic component for surface mounting is known from the PCT Application published under No. WO 83/00408 on Feb. 3 1983 in the name of Joachim SIEG. In this Application, a support of ceramic material ($Al_2O_3$) is provided with a cavity, at whose bottom is soldered an optoelectronic element on one of two metallizations serving for its electrical connection. Conducting passages (metallized holes) permit providing the electrical contacts for surface mounting.

This component has, apart from the moderate thermal conductivity of alumina, the disadvantage that its manufacture is comparatively expensive because of the price of the basic material, in this case ceramic material, and that it is difficult to form the cavity. The cavity is moreover generally rectangular and non-reflective; it consequently does not contribute to the optical efficiency of the component.

SUMMARY OF THE INVENTION

The basic idea of the invention is that as a support use is made of a substrate of silicon which permits the use of technological means well known in the semiconductor industry of collectively manufacturing the components and of then obtaining the individual components by a simple cutting operation, which leads to a low unit price. The basic idea of the invention is not limited, however, to the simple choice of a material and its technology, which are both known, but relates more particularly to the specific adaptation of this technology to this particular case, i.e. the formation of the reflective cavity of each component in its support and of the electrical interconnection rendering this component suitable for surface mounting.

Thus, the device according to the invention is characterized in that the component has a second cavity having dimensions smaller than those of the first cavity and extending from the lower surface of the substrate to an opening of said flat bottom, the first and second cavities having adjacent their surfaces a region of the second conductivity type opposite to the first conductivity type, and in that for surface mounting of the component the second electrode is connected to the upper surface of the substrate by means of a first conductive layer, while the lower surface of the substrate has a second conductive layer in electrical contact with the region of the second conductivity type and a third conductive layer in electrical contact with the substrate.

The four inclined faces can be readily obtained using the known technique of preferential etching. On the other hand, the region of the second conductivity type serves to realize an electrical insulation between the electrical contacts of opposite polarities by a reverse biased diode when a voltage is applied to the electroluminescent element. Thus, the particular polarity is imposed which is chosen for the connection of its electrodes. The electrical continuity between the zone of the second conductivity type of the optoelectronic element and the third conductive layer is obtained via the substrate, which is strongly doped for this purpose.

The second conductive layer is advantageously provided on at least a prolonged portion of said region of the second conductivity type adjacent the lower surface of the substrate. The lower surface of the substrate can then be coated with a first insulating layer having a contact opening on said prolonged part, the second conductive layer extending at least in said opening. The upper surface of the substrate can advantageously be coated with a second insulating layer having at least one window, the first conductive layer extending at least in said window in order to obtain the said electrical contact with the upper surface of the substrate. A said window can have the shape of an elongate rectangle parallel to one side of said reflective cavity so as to improve the electrical contact formed through the substrate. A plurality of windows, for example two, can be provided. The first conductive layer may also extend on the second insulating layer.

According to a preferred embodiment, the second cavity also has four faces arranged in (111) planes inclined with respect to the lower surface of the substrate from which it extends to the opening of said flat bottom.

The invention further relates to a method of manufacturing an optoelectronic component for surface mounting comprising an optoelectronic element arranged on the bottom of a first cavity provided in a support. According to the invention, the support is a highly doped substrate of silicon of a first conductivity type and having upper and lower surfaces orientated along the plane (100), this method comprising the following steps:

(a) depositing first and second insulating layers on the lower and upper surfaces, respectively, of the substrate;

(b) opening at least a first series of first openings in the second insulating layer according to a first two-dimensional raster and corresponding to said first cavities and at least a second series of second openings in the first insulating layer, which openings are smaller than the first openings and are arranged at right angles to these first openings according to a second two-dimensional raster having the same pitch as the first raster and corresponding to said second cavities;

(c) providing the first and second cavities by selective etching of the substrate by a solution susceptible to excavating the latter according to (111) planes inclined with respect to the plane (100) of the upper and lower surfaces until each second cavity via an opening in a flat bottom of a first cavity communicates with said first cavity;

(d) forming in the first and second cavities surface-adjacent regions of the second conductivity type opposite to the first conductivity type;

(e) depositing a metallization comprising a first metallic layer on the surface of the first cavities in order to render the latter reflective and a second metallic layer in electrical contact with the upper surface of the substrate as well as a conductive layer on the lower surface of the substrate having first portions, each of which is in electrical contact with at least one of the regions of the second conductivity type, and second portions, each of which is in electrical contact with the substrate in the proximity of each second cavity; and (f) forming elementary components by soldering optoelectronic elements in such a manner that they each have a zone of the first conductivity type arranged on the flat bottom of a first cavity in electrical contact with the first metallic layer and a zone of the second conductivity type in electrical contact with a said second metallic layer, followed by cutting the substrate so as to sever elementary components, each of which comprises a first and second cavity, an optoelectronic element and at least a part of the first and second portions of the second metallic layer forming an electrical contact with a region of the second conductivity type and with the substrate, respectively.

During step (f), the step of soldering the optoelectronic elements preferably takes place before the step of cutting the substrate. The method advantageously comprises before step (b) a step a' of opening in the second insulating layer a first series of windows for diffusion through them of prolonged parts of the regions of the second conductivity type formed during step (d), and then providing in the said first series of windows a third insulating layer having a thickness smaller than that of the first insulating layer.

The method advantageously comprises between step (a) and step (b) a step a'' of opening in the first and second insulating layers a second and a third series of windows, respectively, for contacting and obturating them through a fourth insulating layer having a thickness smaller than that of the two first layers.

When the step a' is carried out, it precedes the step a'' and the step of forming the third and fourth insulating layers is common.

According to a variation, the step of depositing the third and fourth insulating layers consists in of forming by oxidation a layer of silicon oxide and then by nitridation a layer of silicon nitride.

BRIEF DESCRIPTION OF THE DRAWINGS

In order that the invention may be readily carried out, it will now be described more fully, by way of example, with reference to the accompanying drawings, in which:

FIGS. 1a to 1h show in sectional view parallel to the direction X the steps of manufacturing a preferred embodiment of the invention;

FIGS. 2a and 2b are a bottom view and a plane view, respectively, of a finished component according to the invention; and FIG. 3 shows an electric equivalent circuit diagram.

DESCRIPTION OF THE PREFERRED EMBODIMENTS

In FIG. 1a a substrate 1 strongly doped with a first conductivity type, for example the p+ type doped with $5.10^{18}$ atoms/cm$^3$ and orientated according to the plane (100) and having a thickness of the order of 0.4 mm, is coated on its upper surface 2 and its lower surface 4 with an insulating layer 3 and 5, respectively, comprising an oxide layer of about 0.5 μm.

In FIG. 1b, a two-dimensional raster (X,Y) of rectangular elongate openings 6 (whose shape is represented by a dotted outline in FIG. 2a and represented by the sectional view in the longitudinal direction) is formed through the oxide layer 5, through which openings contact regions 7 strongly doped with the second conductivity type (for example the n+ type doped with $5.10^{19}$ atoms/cm$^3$) are diffused.

In FIG. 1c, two series of strip-shaped contact windows 10 and 11 forming slots as shown in the vertical direction Y in FIG. 2b spaced apart by a pitch x are opened through the thick oxide layer 3. The contact windows 10 are represented with an edge coplanar with the edges 17 of the openings 6. Simultaneously with the windows 10 and 11, strip-shaped contact windows 12 are formed also forming strips as shown in the vertical direction in FIG. 2a spaced apart by a pitch preferably equal to x, but now through the oxide layer 5. The contact windows 12 are represented at right angles to the windows 11.

The outline of the windows 10 and 11 is visible in FIG. 2b and that of the windows 12 is visible in FIG. 2a.

In FIG. 1d, the two surfaces of the substrate are coated with an insulating layer 14 comprising a fine silicon oxide layer 8 having a thickness of about 0.1 μm coated with a fine layer of silicon nitride 9 having a thickness of about 0.1 μm so as to obturate the windows 10, 11 and 12 as well as the openings 6. For the sake of simplicity of the drawing, the layer 14 is shown only at the area of the said windows and openings, the layers 3 and 5 becoming 3' and 5' so as to take into account their supplementary coating with the layers 8 and 9.

In FIG. 1e, square windows 20 are opened in the layer 3' and square windows 21 are opened in the layer 5' adjoining the openings 6. The length of the sides of the squares of the windows 20 is about 0.6 mm and that of the sides of the squares of the windows 21 is about 0.15 mm.

The centers of the windows 20 and 21 are preferably not situated at right angles to each other for reasons which will appear hereinafter.

Subsequently, the cavities 22 and 26 are formed by etching in a solution of potassium. These cavities 22 and 26 are limited due to the preferential character of the attack by walls 23 and 27, respectively, arranged according to planes (111) enclosing an angle a=54° with the surface 2 and 4, respectively. The attack is continued until the cavities 22 and 26 meet at the level of openings 25 of a flat bottom of the cavities 22. The openings 25 are advantageously shifted laterally in the corresponding flat bottoms 24 so as to facilitate subsequently the positioning of the optoelectronic elements.

In FIG. 1f, regions 30 of the second conductivity type, for example the n+ type strongly doped with $10^{19}$ atoms/cm$^3$, are diffused into the cavities 22 and 26. Due to the fact that the windows 21 adjoin the windows 6, the regions 30 meet the regions 7 of the same type diffused beforheand.

In FIG. 1g, a part of the insulating layers 14 is removed by etching in such a manner that the substrate is exposed through the windows 10, 11 and 12 and windows 15 are opened at the ends of the regions 7 opposite to the cavities 26. Subsequently, a complete metallization of the upper surface of the substrate is obtained by pulverization so that a metallic layer 36 covering the subsisting parts of the layer 3 and in contact with the substrate 1 through the windows 10 and 11 is obtained at the surface and the surface 23 and the bottom 24 of the cavities 22 are covered by a metallic layer 31. It should be noted that the slight underetching occurring during the attack of the cavities 22 by the potassium solution has the effect that the upper part 33 of these cavities is not coated with metal, which permits obtaining an electrical insulation between the metallizations 31 and 35.

The step of pulverization also comprises the formation through a mask of metallic strips 40 extending on the one hand on the windows 12 and 15 so as to get into contact with the substrate 1 and on the other hand on the part of the insulating layer 5 situated between these windows between adjacent cavities 22.

FIG. 1h illustrates the last steps to obtain components. The metallizations 54 of the zones 53 of the first conductivity type of the electroluminescent diodes 50 are collectively soldered by solder 51 on the metallizations 31 of the bottoms 24 (see FIG. 1e) of the cavities 22. As the centers of the windows 20 and 21 are not at right angles to each other, the opening 25 is situated at a corner of the flat bottom 24, which ensures a good soldering of the element 50. The height of the cavities 22 is advantageously chosen so that the diodes 50 have their upper metallization 52 and that of their zone 55 of the second conductivity type, at the same level as the metallizations 35. This permits soldering a conductive wire 56 to all the metallizations 35 and 52 of the same row in the direction X.

The individual components are then obtained by a simple cutting operation parallel to the directions X and Y. The outline of the cutting planes parallel to the direction Y and spaced apart by a pitch x is indicated by dot-and-dash lines in FIG. 1b. Each of the conductive strips is divided into two strips 40' and 40''. After this cutting operation in two directions, the component is ready for use.

The electroluminescent diode 50 has a diode D connected parallel and inversely to its terminals (FIG. 3). This diode D is constituted by the substrate 1 of the first conductivity type and by the diffused regions 7 and 30 of the second conductivity type.

In fact, the electroluminescent diode 50 has its zone 53 of the first conductivity type connected to the metallization 31 itself in electrical contact with the diffused region 30 of the second conductivity type and its zone 55 of the second conductivity type in electrical contact with the substrate 1 of the first conductivity type through the metallization 52 of the wire 56 and the metallization 35 covering the whole upper surface of the component.

With reference especially to FIGS. 2a and 2b, the strongly doped substrate 1 ensures the electrical continuity between the metallization 35 connected to the zone 55 and the metallization 40' situated at the lower surface of the component and covering the window 12. The other metallization of the lower surface of the component, i.e. the metallization 40'', which covers the window 15, is in electrical contact with the zone 53 through the diffused zones 7 and 30. It should be noted that the metallizations 40' and 40'' are arranged in this configuration symmetrically to the diode 50 and along the edges of the component, which is favorable for surface mounting.

On the other hand, the presence of a metallization 31 on the surface of the cavity 22 imparts to this cavity reflecting properties, which enables this cavity to return to the user the light emitted by the lateral surface of the electroluminescent diode 50.

The invention is not limited to the embodiment described and illustrated, which is to be considered only as a more favorable embodiment of the invention.

For example, the formation (FIG. 1d) of the windows 6 simultaneously with the windows 11 and 12 has for its object to minimize the number of these operations and also to accurately align the windows of two surfaces with respect to each other.

On the other hand, with regard to the structure, it should be noted that the zone 50 could contacted without using the supplementary diffusion 7, for example, by forming after mounting the diodes 50 a thick metal layer by silk-screen printing at least in the openings 26.

What is claimed is:

1. An optoelectronic component comprising a highly doped silicon substrate of a first conductivity type having upper and lower surfaces orientated along the plane (100) and an optoelectronic element disposed on the bottom of a first cavity provided in said substrate, the surface of the first cavity being coated with a metallic layer such that it becomes reflective and said cavity having four faces disposed along (111) planes inclined with respect to the upper surface and a flat bottom also coated with the metallic layer, the optoelectronic element having a first electrode comprising a zone of the first conductivity type soldered at said flat bottom on the metallic layer and a second electrode comprising a zone of the second conductivity type connected electrically to the upper surface of the substrate, said component comprising a second cavity having dimensions smaller than those of the first cavity and having a surface extending from the lower surface of the substrate to an opening of said flat bottom, the first and second cavities having a region of the second conductivity type opposite to the first conductivity type adjacent to their surfaces, the second electrode being connected to the upper surface of the substrate by means of a first conductive layer for surface mounting of the component on the surface of said first cavity, and the lower surface of the substrate comprising a second conductive layer in electrical contract with the region of the second conductivity type and a third conductive layer in electrical contact with the substrate.

2. An optoelectronic component as claimed in claim 1, characterized in that the second conductive layer is provided on at least a prolonged portion of said region of the second conductivity type adjacent the lower surface of the substrate.

3. An optoelectronic component as claimed in claim 2, characterized in that the lower surface of the substrate is coated with a first insulating layer having a contact opening on said prolonged part, and in that said second conductive layer extends at least in said opening.

4. An optoelectronic component as claimed in claim 1, 2 or 3, characterized in that the upper surface of the substrate is coated with a second insulating layer having at least one window, and in that said first conductive layer extends at least in said window to form said electrical contact with the upper surface of the substrate.

5. An optoelectronic component as claimed in claim 4, characterized in that said at least one window is strip-shaped and parallel to one side of said reflective cavity.

6. An optoelectronic component as claimed in claim 4, characterized in that said first conductive layer also extends on the second insulating layer.

7. An optoelectronic component as claimed in claim 1, 2 or 3, characterized in that the second cavity has four faces arranged along planes (111) inclined with respect to the lower surface of the substrate, from which it extends, to the opening of said flat bottom.

8. An optoelectronic component as claimed in claim 1, 2 or 3, characterized in that at least one of said conductive layers is metallic.

* * * * *